(12) United States Patent
Taft et al.

(10) Patent No.: US 7,728,753 B2
(45) Date of Patent: Jun. 1, 2010

(54) CONTINUOUS SYNCHRONIZATION FOR MULTIPLE ADCS

(75) Inventors: Robert Callaghan Taft, Munich (DE); Heinz Werker, Huglfing (DE); Pier Francese, Eichenau (DE); David Barkin, San Francisco, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 12/250,437

(22) Filed: Oct. 13, 2008

(65) Prior Publication Data

US 2010/0090876 A1 Apr. 15, 2010

(51) Int. Cl.
*H03M 1/34* (2006.01)
(52) U.S. Cl. ...................... 341/165; 375/243
(58) Field of Classification Search ......... 341/140–170; 375/243, 254, 354, 355, 364
See application file for complete search history.

(56) References Cited

U.S. PATENT DOCUMENTS

| | | | | |
|---|---|---|---|---|
| 5,610,943 A * | 3/1997 | Kakuishi et al. | ............ | 375/243 |
| 5,615,235 A * | 3/1997 | Kakuishi et al. | ............ | 375/355 |
| 6,268,820 B1 * | 7/2001 | Sherry et al. | ................ | 341/155 |
| 7,049,994 B2 * | 5/2006 | Tsujita | ........................ | 341/161 |
| 7,148,828 B2 * | 12/2006 | Fernandez et al. | .......... | 341/120 |
| 7,215,273 B2 * | 5/2007 | Waldner | ...................... | 341/155 |
| 7,466,251 B2 * | 12/2008 | Uchino | ........................ | 341/120 |

* cited by examiner

*Primary Examiner*—Lam T Mai

(57) ABSTRACT

A system, apparatus and method for continuous synchronization of multiple ADC circuits is described. The ADC circuits can be arranged in a master-slave configuration within the system so that the converter clock is subdivided into slower speeds for the data output clock or for the control of de-multiplexing the outputs onto a wider bus, while maintaining ADC-to-ADC synchronization resilient to perturbations from noise and other upset sources. The configuration of the ADCs in the master-slave configuration can be varied according to overall system requirements in any one of a sequential configuration, a parallel configuration or a tree type of configuration, as well as others. Digital and/or analog timing adjustments can be made to each of the ADC circuits. The master clocking signals can be generated by a master clock generator circuit, which is either internally implemented in an ADC circuit, or externally implemented as a separate master clock generator circuit.

27 Claims, 11 Drawing Sheets

CONTINUOUS SYNCHRONIZATION FOR MULTIPLE ADCS

FIELD OF INVENTION

The present description relates to systems that include multiple analog-to-digital converter (ADC) circuits. More particularly, the present disclosure details a synchronization apparatus, system and method for aligning the timing relationship between multiple ADC circuits.

BACKGROUND

ADC circuits are useful in many applications where it may be desirable to quantize an analog input signal into a digital output signal. A variety of ADC architectures have been employed in conventional architectures including flash converters, folding converters, sub-ranging converters, multi-step converters, pipeline converters and successive approximation converters. In some system, multiple ADC circuits are used so that multiple analog signals can be captured at the same time.

One example application of multiple ADC circuits is a multi-channel oscilloscope, where one ADC circuit is used for each individual channel of the oscilloscope. For this example application, data from each channel of the oscilloscope is represented as a separate waveform on the display. Therefore, the timing relationship between each ADC in the multi-channel oscilloscope needs to be known so that the waveforms can be aligned with one another on the display.

In another example application of multiple ADC circuits, a phase-array antenna system includes a multiplicity of antenna elements arranged in an array. Each of the antenna elements includes a receiver circuit. Data from each element of the antenna array can be utilized in such a way as to identify the difference in relative phases of the signals from each antenna element, and thus the selective use of the antenna elements can be used to synthetically steer the beam of the antenna in a desired direction, while suppressing undesired directions. The output of each of the receiver circuits can be processed by ADC circuits. Since the phase and timing information of the antenna array are critical, the timing relationship between the ADC circuits need to be known to properly synthesize the aperture and direction for the beam of the antenna.

BRIEF DESCRIPTION OF THE DRAWINGS

Non-limiting and non exhaustive embodiments are described with reference to the following drawings.

DETAILED DESCRIPTION

Figure 1A:
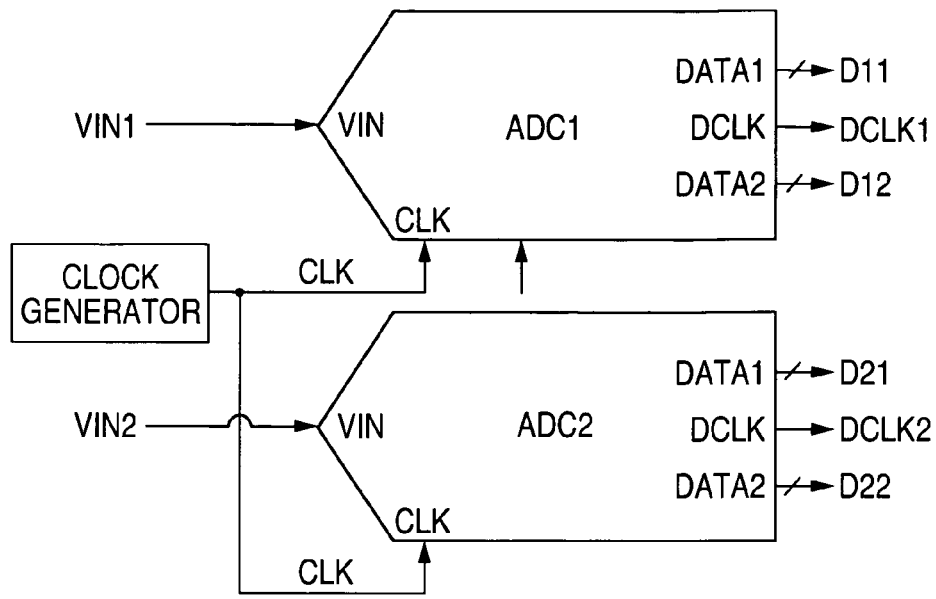
FIGS. 1A-1B illustrate an example of a conventional system including multiple ADCs.

Various embodiments will be described in detail with reference to the drawings, where like reference numerals represent like parts and assemblies throughout the several views. References to various embodiments do not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context clearly dictates otherwise. The meanings identified below are not intended to limit the terms, but merely provide illustrative examples for use of the terms. The meaning of "a," "an," and "the" may include reference to both the singular and the plural. The meaning of "in" may include "in" and "on." The term "connected" may mean a direct electrical, electro-magnetic, mechanical, logical, or other connection between the items connected, without any electrical, mechanical, logical or other intermediary items. The term "coupled" can mean a direct connection between items, an indirect connection through one or more intermediaries, or communication between items in a manner that may not constitute a physical connection. The term "circuit" can mean a single component or a plurality of components, active and/or passive, discrete or integrated, that are coupled together to provide a desired function. The term "signal" can mean at least one current, voltage, charge, data or other such identifiable quantity including electrically coupled and magnetically coupled signals.

Briefly stated, the present disclosure proposes a continuous synchronization to multiple ADC circuits arranged in a master-slave configuration within a system. By using a master-slave configuration, the converter clock (CLK) can be subdivided into slower speeds for the data output clock (DCLK), or data ready clock, while still maintaining resilient tolerance to perturbations from noise and other sources. The configuration of the ADCs in the master-slave configuration can be varied according to overall system requirements in any one of a sequential configuration, a parallel configuration a tree type of configuration, as well as others. Digital and/or analog timing adjustments can be made to each of the ADC circuits. The first set of clocking signals can be generated by a master clock generator circuit, which is either internally implemented in the first ADC circuit, or externally implemented as a separate master clock generator circuit.

Figure 1B:
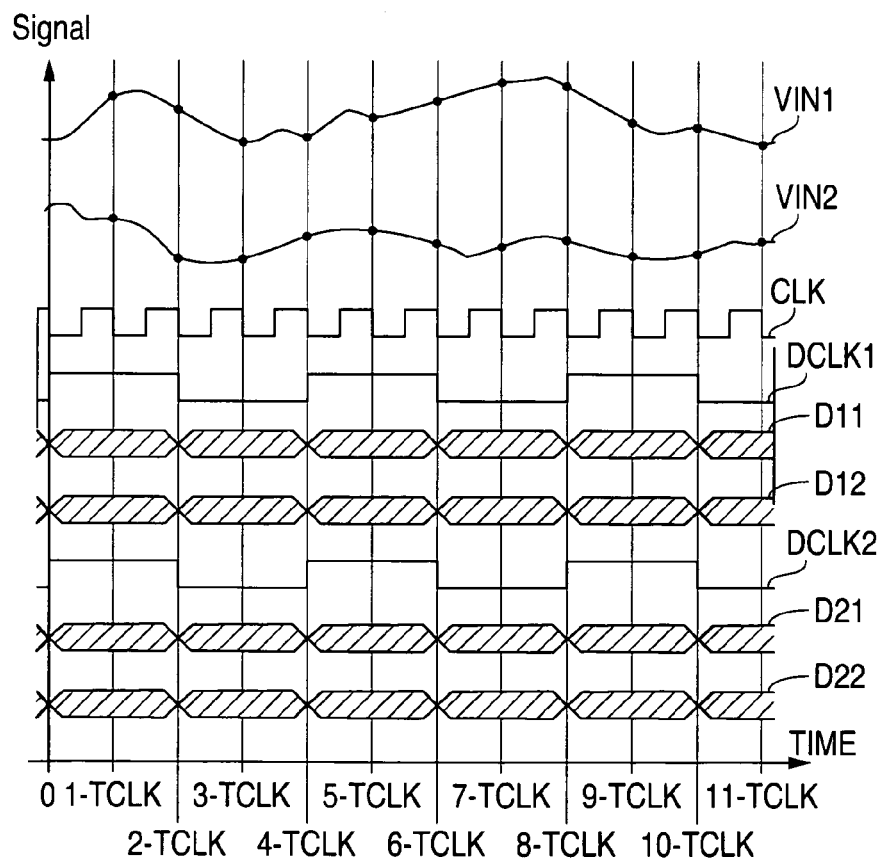

Some conventional systems use multiple ADC circuits as illustrated in FIGS. 1A through 1B. As illustrated, a first ADC circuit (ADC1) is arranged to convert a first analog signal (VIN1) into a first digital code (D11 and D12) using a clock signal (CLK), while a second ADC circuit (ADC2) is arranged to convert a second analog signal (VIN2) into a second digital code (D21 and D22) using the same clock signal (CLK). The clock signal (CLK) can be provided by a clock generator circuit.

Internally, each of the ADC circuits are arranged to sample their respective input signals in response to the clock signal (CLK), as illustrated in FIG. 1B by the dots along the input signals (VIN1 and VIN2). The period of the clock signal (CLK) is given as TCLK, and therefore each sample from the analog waveform is separated in time by one clock period (TCLK), as illustrated. In many high-speed converters (e.g., converters that operate with a clock signal of 250 MHz or higher), the output of the converters is de-multiplexed to produce wider words at a slower rate for ease of data capture. Similarly, high-speed output data is more easily captured using a double-data-rate (DDR) topology.

As illustrated in FIG. 1B, the data output clock from ADC1 is DCLK1, which has a clock period that is four times (4×) longer than that of the input clock signal (CLK), or a clock frequency that is a factor of four smaller (DCLK1=CLK/4). A transition of DCLK1 in either direction is used to signal a change in the data values D11 and D12. DCLK1's clock period of 4*TCLK is illustrated by the transitions at times 0, 2*TCLK, 4*TCLK, etc. The data from ADC1 is reconstructed or multiplexed back together by interleaving outputs D11 and D12. Also illustrated in FIG. 1B, the data output clock from ADC2 is DCLK2, which also has a clock period that is four times (4×) longer than that of the input clock signal (CLK). As illustrated, DCLK2 has a clock period of 4*TCLK, as illustrated by the transitions at times 3*TCLK, 5*TCLK, etc. The data from ADC2 is also interleaved using outputs D21 and D22, which is a DDR output that transitions on both rising and falling edges of DCLK2.

In one example system, ADC1 and ADC2 are each 10-bit converters with DDR outputs that are each de-multiplexed to create 20-bit wide words. The DDR output operates with a slower internal clock signal (4 times slower in this example) where the data is sent on both rising and falling edges. For example, ADC1 has data ready on both rising and falling edges of DCLK1, while ADC2 has data ready on both rising and falling edges of DCLK2. The slower internally generated DDR DCLK signal simplifies the data-capture of both itself and of high-speed data. DDR clocking eases data capture because it simplifies de-multiplexing (inside the next digital device) of the data from the ADC, using the phase of the DDR DCLK to determine which bus or set of latches the data should be applied to. Each ADC's internal circuits generate an independent data ready clock (DCLK) signal, and therefore there is no phase correlation between the ADCs. However, the present disclosure has identified that the DCLK signals in some systems needs to be aligned in time so that the overall system can capture and process the digital data correctly. For example, the data from each of the ADCs may need to be de-multiplexed, where alignment of DCLK ensures that the sampling instance and routing of output to each of the de-multiplexing banks is also aligned (thus the ADC's analog signals, digital encoding, and multiplexed outputs are all within the same clock domain for processing the totality of the ADCs).

As illustrated by FIG. 1B, there is no guaranteed alignment for the transitions between DCLK1 and DCLK2. For example, DCLK1 has a rising transition at 4*TCLK and 8*TCLK, while DCLK2 has a rising transition at 3*TCLK and 7*TCLK. This misalignment in the data output clock signals can result from a variety of factors such as mismatched signal delays between the clock generator and the ADC circuits, process driven mismatches in circuits, as well as many other environmentally sourced problems such as noise, perturbations in the power supply lines, and cosmic rays (e.g., in applications such as satellites and other electronics that may be found in space borne applications). Most commonly lack of synchronization also arises from the random state of non-volatile latches when they are first powered up. Although illustrated as a misalignment of approximately 1*TCLK, the alignment can have an uncertainty up to three complete clock periods (e.g. Δ=0.1*TCLK, 2*TCLK, or 3*TCLK).

In one possible solution, a system level synchronization could be used. In this example, there is no attempt to synchronize between ADCs and additional digital processing circuitry is used to resynchronize the digital data that is coming out of the ADCs. In addition to the complexity of the extra digital processing circuitry necessary to process the high-speed data outputs, additional overhead circuitry is required to determine the phase relationship between of the ADC circuits. In some cases the additional overhead circuitry can be implemented as a digital solution, while in other cases the additional circuitry uses analogue multiplexing of the inputs to align the inputs of all of the ADC circuits with a global reference pulse. The present disclosure recognizes that system-level synchronization solutions can be unworkable since they require very complex digital processing circuitry and complex overhead circuitry some of which operate at high speed.

In another possible solution, a manual synchronization topology could be used, where each ADC is manually synchronized. One problem recognized in contemplation of the present disclosure is that manual synchronization requires a very accurate synchronization pulse for the data output clock (DCLK), which may be adversely impacted by the setup and hold timing requirements which must be met with respect to the converter clock (CLK).

For both solutions described above (system level synchronization and manual synchronization), there is no reasonable recovery for a dynamic loss of synchronization during operation when the system is upset. For example, the system may be upset by an electronic noise source in the environment, or possible by a single-event upset such as may be found in a radiation environment (e.g., nuclear radiation created by impinging cosmic rays or the spontaneous decay of trace amounts of radioactive isotopes in the device, package, or system).

Figure 2A:
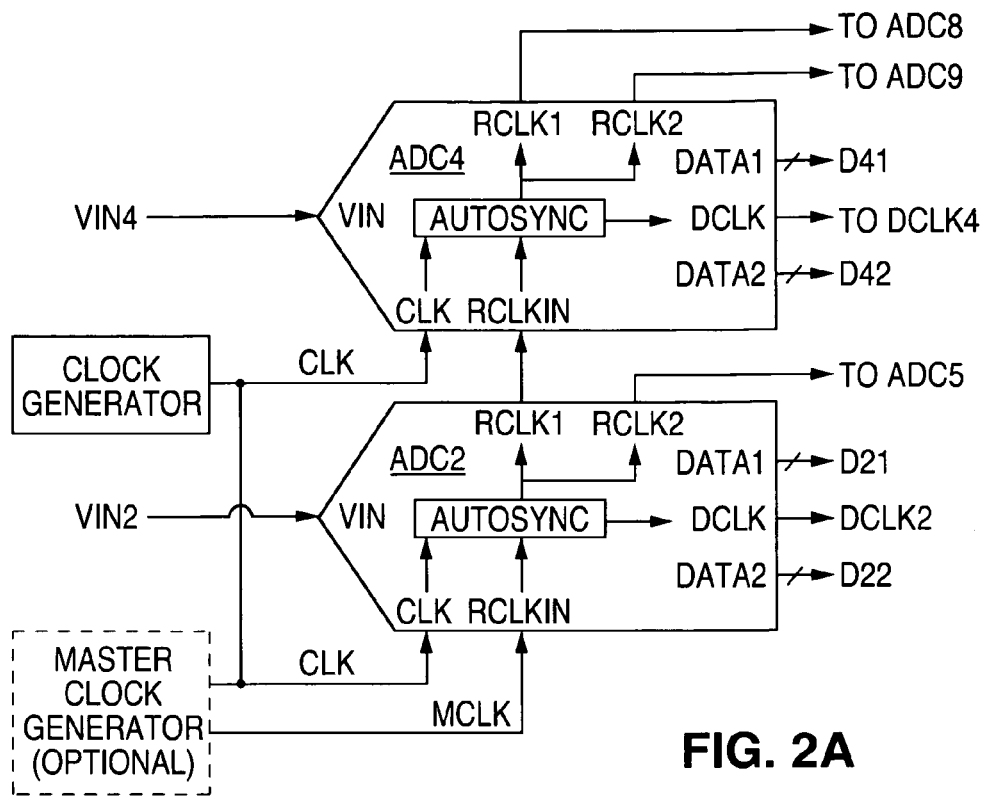
FIGS. 2A-2B illustrate a high level block diagram and timing waveforms for the proposed ADC arrangement including multiple ADCs with continuous synchronization capabilities.
Figure 2B:
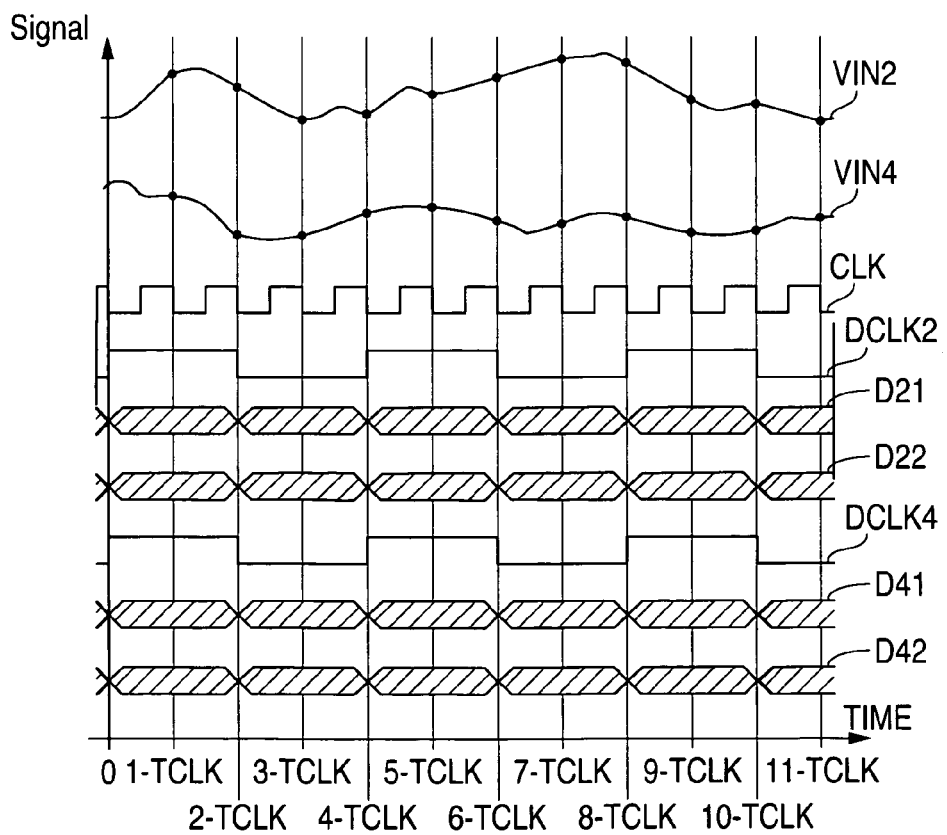

The present disclosure proposed a continuous synchronization to a set of ADC circuits arranged in a master-slave configuration within a system. By using a master-slave configuration, the converter clock (CLK) can be subdivided into slower speeds for the data ready clock output (DCLK) while still maintaining resilient tolerance to perturbations from noise and other sources. FIGS. 2A-2B illustrate a high level block diagram and timing waveforms for the proposed ADC arrangement including multiple ADCs with continuous synchronization capabilities.

Each of the ADC circuits (ADC2 and ADC4) includes an input terminal for an analog input signal (VIN), a converter input clock signal (CLK), and a reference input clock signal (RCLKIN). Each of the ADC circuits also includes an output terminal for a data output clock (DCLK), a first data output (DATA1), a second data output (DATA2), and one or more reference output clocks (e.g., RCLK1 and RCLK2). The analog input signal (VIN) for ADC2 corresponds to signal VIN2, while the analog input signal (VIN) for ADC4 corresponds to signal VIN4. A clock generator circuit can be used to generate the converter clock input signal (CLK), which is common to all of the ADC circuits. The data outputs for ADC2 correspond to data signals D21 and D22, which are multi-bit signals, and which are aligned in time to data output clock signal DCLK2. Similarly, the data outputs for ADC4 correspond to data signals D41 and D42, which are also multi-bit signals, and which are aligned in time with data output clock signal DCLK4.

As illustrated in FIG. 2A, each ADC circuit (ADC2, ADC4, etc.) internally includes a synchronization control block (AutoSync) that generates two or more signals that are responsive to the external clock signal (CLK) for the converter, and also responsive to a reference input clock signal (RCLKIN). One of the signals produced corresponds to the data output clock (DCLK), or data ready clock, while another of the signals produced corresponds to a reference output clock signal (RCLK). In some examples, multiple reference output clock signals (RCLK1, RCLK2, etc.) may be used, each being aligned in phase and time with the data output clock (DCLK) as will be described.

For each given system implementation, there is a master clock generator circuit. The master clock generator circuit can either be internal to the first ADC circuit, or external to the ADC circuits depending on the specific desired implementation. The data output clock (DCLK) for each ADC is generated with a fixed phase relationship from the converter input clock signal (CLK) and the reference input clock signals (RCLKIN). The reference input clock signal (RCLKIN) is generated from either the master clock generator circuit or from another ADC circuit. For example, the reference input clock signal (RCLKIN) for converter ADC2 is illustrated as MCLK from the master clock generator, while the reference input clock signal (RCLKIN) for converter ADC4 is from the reference output clock signal (RCLK1) of ADC2. Other converters (see FIGS. 3A-3F) are similarly arranged so that each converter is synchronized as a "slave" of another converter, or the master.

The data output clock signal (DCLK) of each ADC circuit is generated from the converter clock input signal (CLK) so that the ADC circuit's timing (VIN sampling instance, signal processing, encoding and data transmission) are in the same clock domain as all of the other converters.

Since the phase relationship between the converter clock input signal (CLK) and reference input clock signal (RCLKIN) is unknown, an adjustment parameter may be desired to control their relative delays. For example, an intentional delay can be generated between the reference input clock signal (RCLKIN) and the converter input clock signal (CLK) through the use of a control register (or latch, for example) to ensure sufficient setup and hold times in the ADC circuit. Once this register value is known for a particular ADC circuit, the setup and hold times do not appreciably change over varying semiconductor process corners or operating temperature (for the same system layout) since the delay paths between the reference input clock signal (RCKLIN) and the converter input clock signal (CLK) within each ADC can be designed to match.

The fixed phase relationship between the data output clocks (DCLK) of each ADC circuit (e.g., ADC1, ADC2, ADC3 . . . ) can vary between 0*TCLK and 3*TCLK as described previously. This variation depends in part on printed circuit (PC) board layout, the length of cable and interconnect used in routing signals on and off the PC board. To account for the variation in timing, the AutoSync circuit can include further internal adjustments through the use of additional registers and/or latches.

The above described register settings can be determined once for each of the slave ADC circuits in a given system. Once known, the settings can simply be initialized on power-up (e.g., in response to a POR signal), periodically (e.g., based on another system clock signal), or on demand (e.g., in response to an INIT signal) so that initialization of the registers is ensured before operation of the ADC circuits.

FIGS. 3A-3F illustrate block diagrams for various alternative arrangements of multiple ADCs in a system that facilitates the described continuous synchronization capabilities.

Figure 3A:
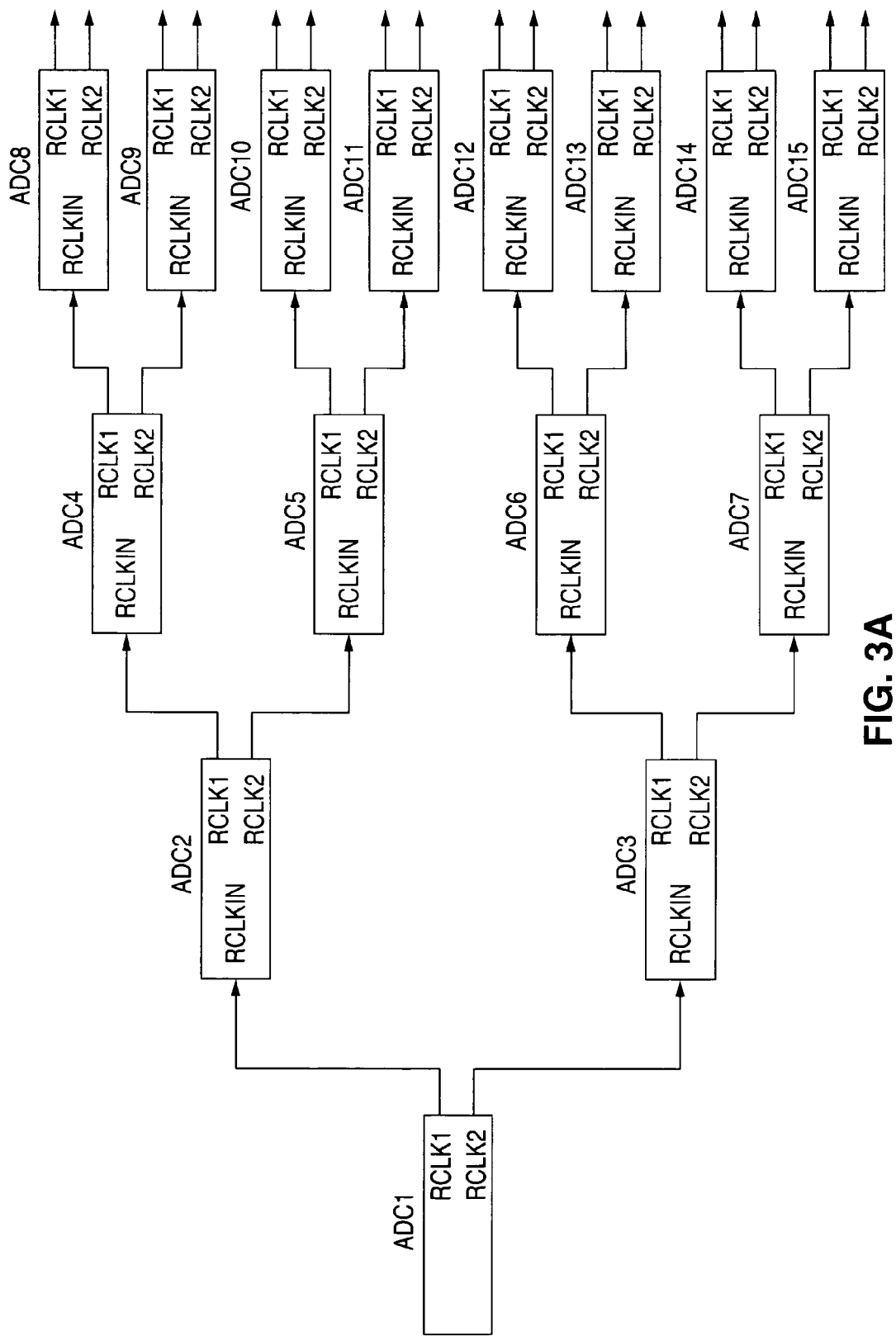
FIGS. 3A-3F illustrate block diagrams for various alternative arrangements of multiple ADCs in a system that facilitates the described continuous synchronization capabilities.
Figure 3B:
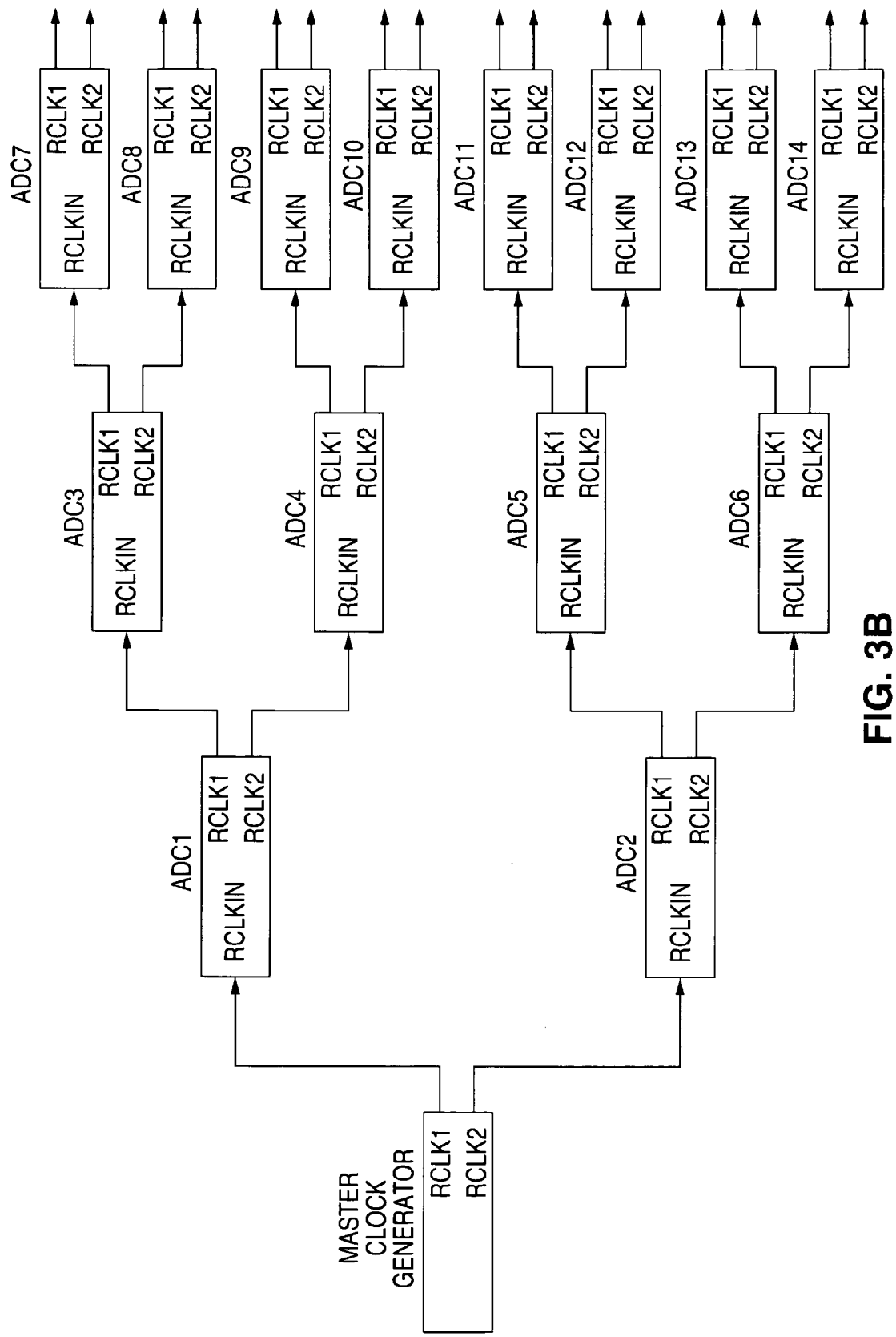

As illustrated in FIG. 3A, a binary tree arrangement can be employed, where each ADC can generate a reference input clock signal (RCLKIN) for two additional ADC circuits. The first ADC circuit (ADC1) is configured as the master for two more ADC circuits (ADC2 and ADC3). Therefore, reference output clock signal RCLK1 from ADC1 is the reference input clock signal (RCLKIN) for ADC2, while reference output clock signal RCLK2 from ADC1 is the reference input clock signal (RCLKIN) for ADC3. ADC circuit ADC2 in turn generates another two reference output clock signals (RCLK1, RCLK2) as the reference input clock signals (RCLKIN) for ADC4 and ADC5. Similarly, ADC circuit ADC3 also generates another two reference output clock signals (RCLK1, RCLK2) as the reference input clock signals (RCLKIN) for ADC6 and ADC7. Each ADC circuit thus generates another two reference clocks that propagate through the binary tree arrangement of the ADC circuits. As illustrated in FIG. 3B, the reference input clock signals (RCLK1, RCLK2) from the first converter of FIG. 3A can alternatively be generated by a master clock generator circuit, with a similar binary tree implementation.

Figure 3C:
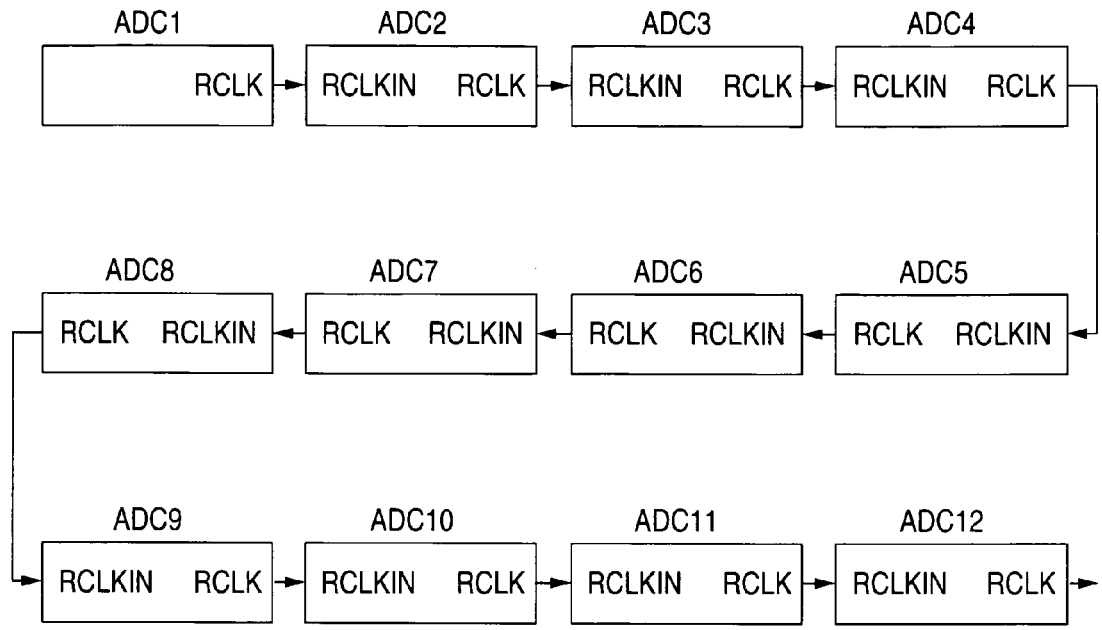

As illustrated in FIG. 3C, a daisy-chained or sequential implementation is also possible. Where the reference output clock signal (RCLK) from each preceding ADC circuit is the reference input clock signal (RCLKIN) for each subsequent ADC in the sequence. Although daisy-chaining (i.e., with each ADC having only one reference clock driving only one other ADC) does work in some implementation, an upset at the first ADC circuit (ADC1) can result in an upset persisting for a much longer time, as it propagates sequentially through each of the ADC circuits. For example, when fifteen converters are used, the perturbation extends through each of the fifteen converters in the sequential chain. Using the binary tree topology of FIGS. 3A and 3B, a perturbation at the first ADC circuit (ADC1) only propagates through three levels instead of fifteen.

Figure 3D:
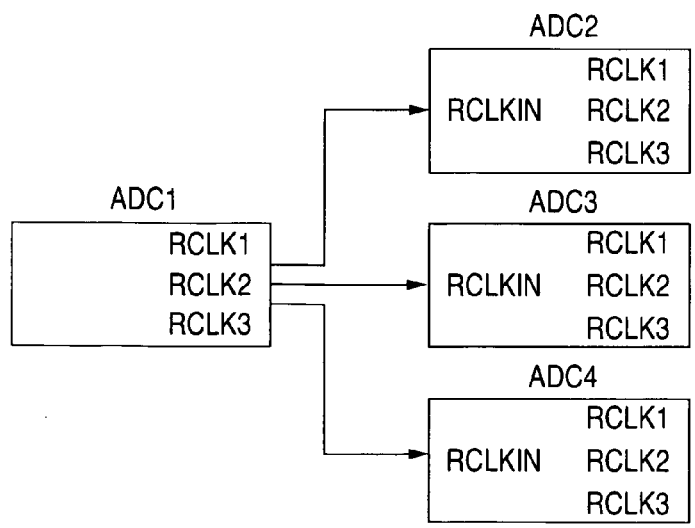
Figure 3E:
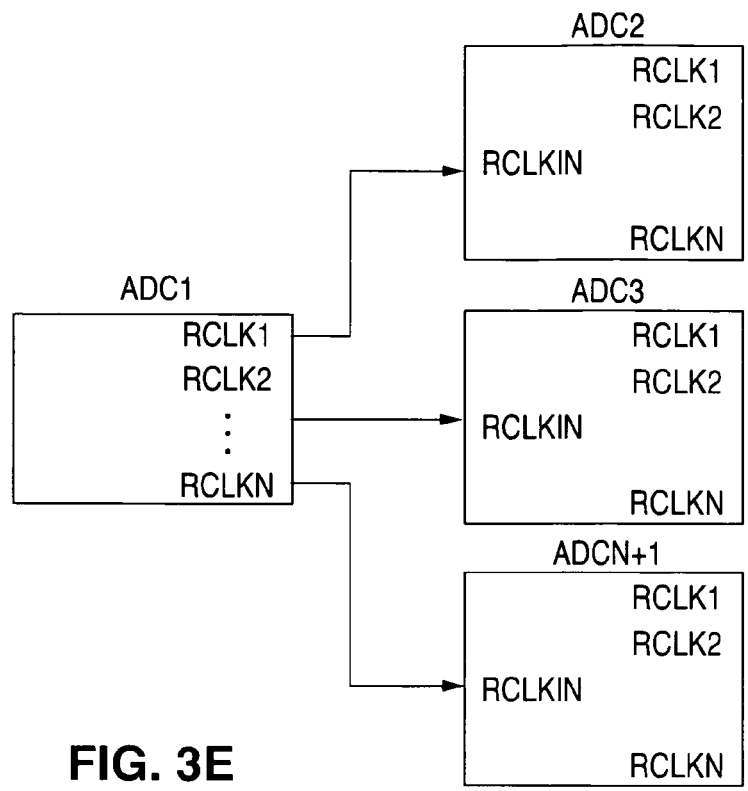
Figure 3F:
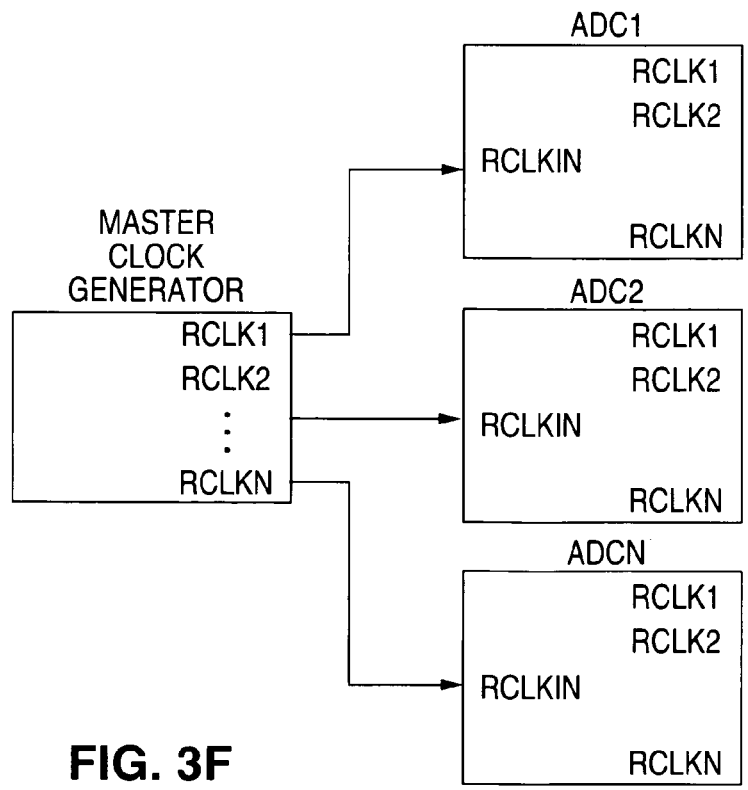

The relative advantage of the tree-type structure increases with an increasing number of converters. Therefore, the tree structure need not be limited to binary tree structures. For example, as shown in FIG. 3D, each converter could generate three reference output clocks signals (RCLK1, RCLK2, RCLK3), arranged in a tree structure. As shown in FIG. 3E, the tree structure can be abstracted to include any number of reference output clocks signals such as N reference output clocks signals (RCLK1, RCLK2 . . . RCLKN), arranged in a tree structure. As illustrated in FIG. 3F, the reference input clock signals (RCLK1, RCLK2 . . . RCLKN) from the first converter of FIG. 3E can alternatively be generated by a master clock generator circuit with a similar tree structure. Although higher order propagation trees are also possible, the improvement over a binary-tree structure may not be very great in some implementations.

Figure 4A:
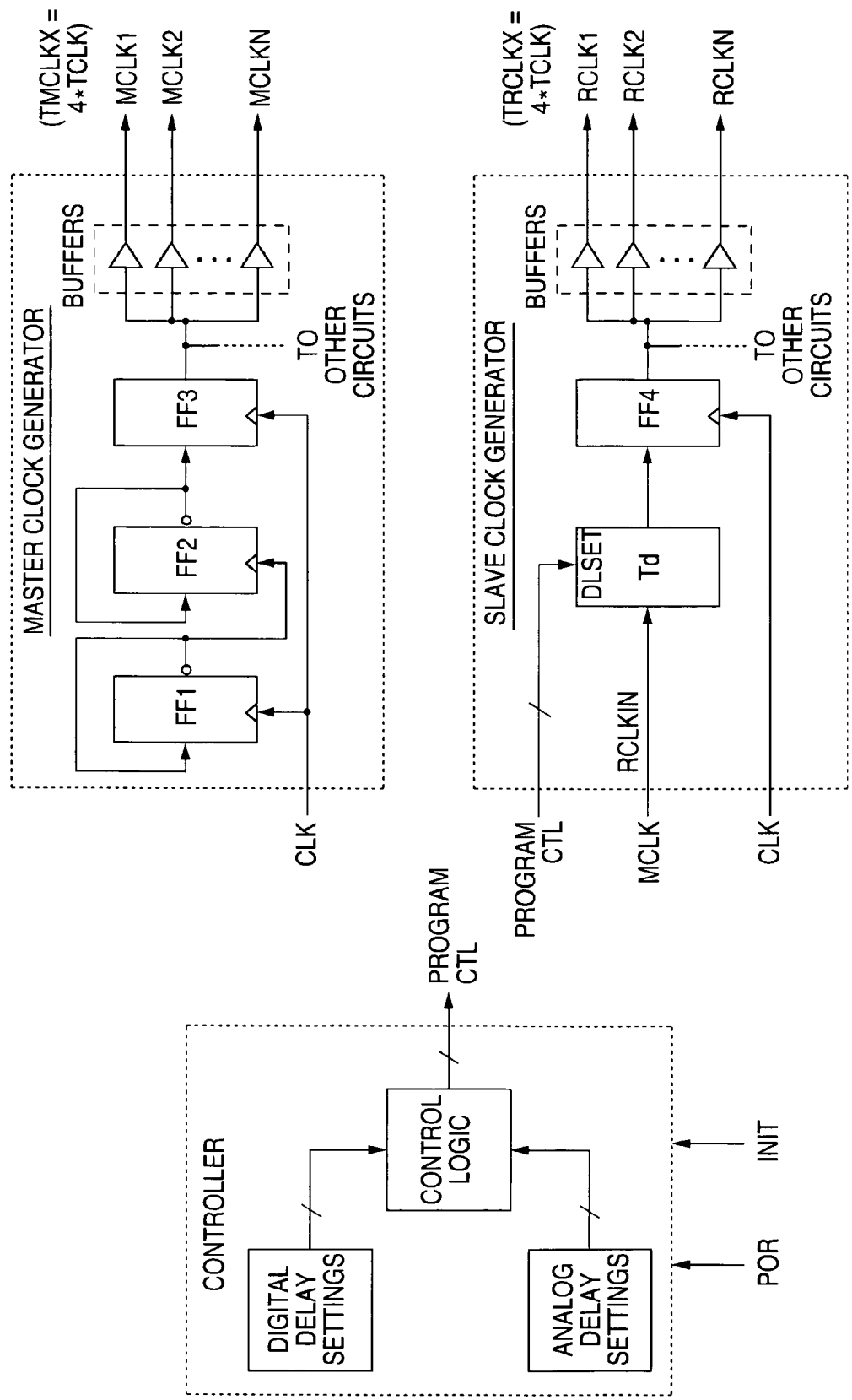
FIGS. 4A-4C are detailed schematic diagrams illustrating example clock generators and related controllers for the described multiple ADC systems with continuous synchronization capabilities.
Figure 4B:
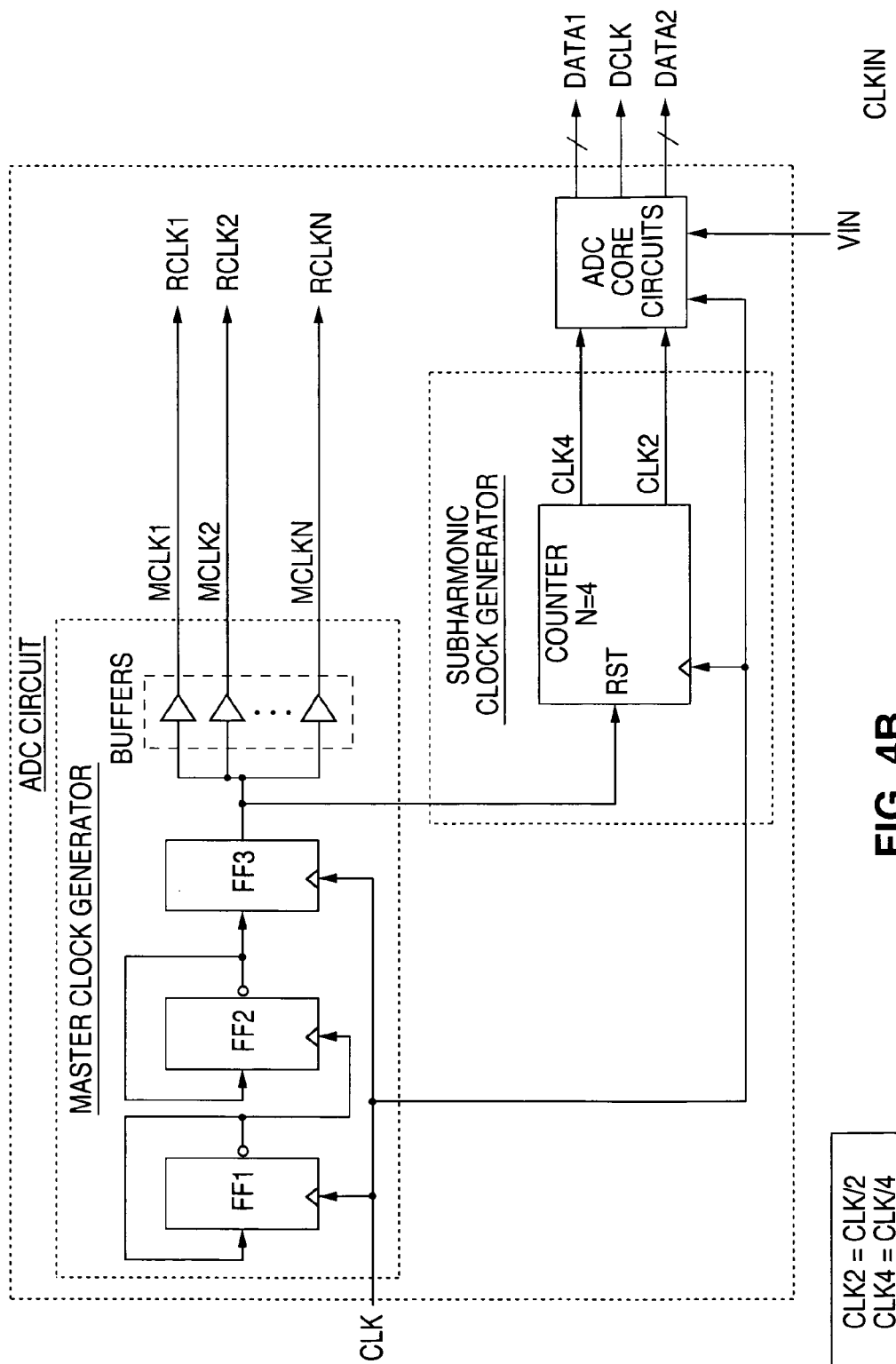
Figure 4C:
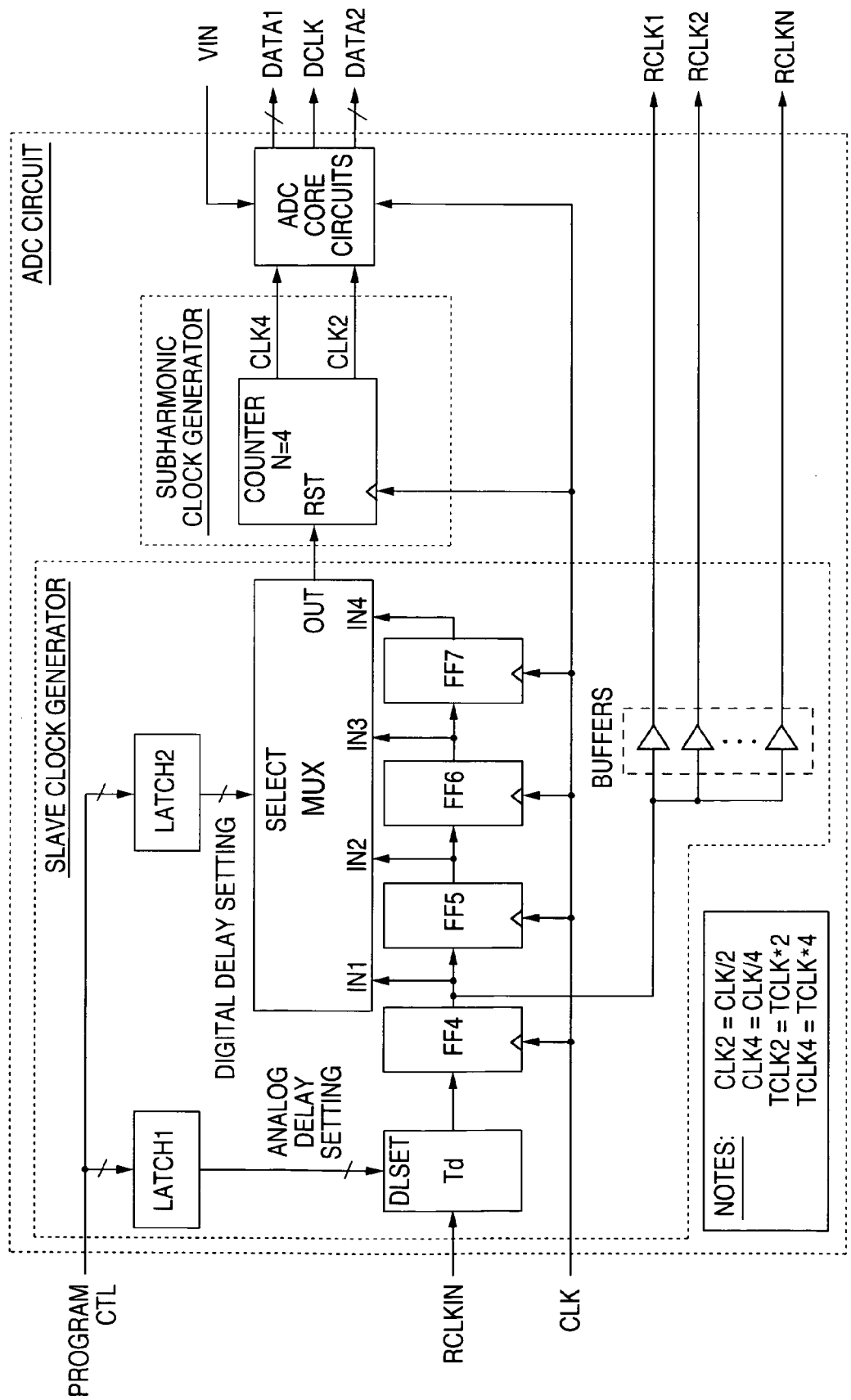

FIGS. 4A-4C are detailed schematic diagrams illustrating example clock generators and related controllers for the described multiple ADC systems with continuous synchronization capabilities. As illustrated in FIG. 4A, an example system includes a controller, a master clock generator and a slave clock generator. The master clock generator can be internal to the first ADC circuit, or external to the first ADC circuit depending on the specific topology and desired implementation.

The controller includes a control logic block that is arranged to generate one or more program control signals (PROGRAM CTL). The program control settings can be initialized by a power on reset signal (POR), periodically initiated by the system based on either a clock signal or some other demand based event with an initialization signal (INIT) as may be desired. The program control settings include digital delay settings and analog delay settings. In some implementations described below, the controller can be further arranged for adjusting the format of the digital data output signals (i.e., DATA1 and DATA2 of FIG. 2A) and the corresponding output clock settings for the converters so that a variety of data output formats can be used (see below).

The analog delay settings can be used to adjust the relationship between the converter clock signal (CLK) and reference input clock signal (RCLKIN) for each respective converter. This will be described in further detail below.

The digital delay settings for each ADC circuit can be adjusted such that the reference input clock signal (RCLKIN) for each ADC is delayed in time by an integer number of clocks relative to the converter clock signal (CLK). This will be described in further detail below.

The data output format is typically the same for all ADC circuits in a given system. The data output format can generally be described as either a non-DDR format or a DDR format. In a non-DDR format the digital data output signals transition on a single clock edge (either a rising edge or a falling edge) of the output clock signal. In a DDR format the digital data output signals transition on both edges (both the rising edge and the falling edge) of the output clock signal. The frequency and timing alignment of the data output clock signal (DCLK) must be appropriately selected based on the desired data output format. In some examples, the data output format is programmable, and therefore the frequency of the data output clock signal relative to the converter input clock signal should also be programmable, while in other examples, the data output format is non-programmable.

As described previously, the data output format in many of the described high-speed ADC circuits is provided as dual output signals that are de-multiplexed. For example, in a system where the digital data output is a by-2 de-multiplexed output non-DDR format, the data output clock signal (DCLK) may be half as fast as the converter input clock signal (CLK), such as where DCLK=RCLK=CLK/2. In a by-2 de-multiplexed output DDR system, the data output clock signal (DCLK) may be a quarter as fast as the converter input clock signal (CLK), such as where DCLK=RCLK=CLK/4. Other clock multipliers may also be desired such as in by-4 de-multiplexed output DDR systems, where DCLK=RCLK=CLK/8. As described previously, the data output format can be programmable in some implementations, and therefore the corresponding output clock signal should be correspondingly programmed according to the selected data output format (e.g., an appropriate clock multiplier is selected, with appropriate timing and phase alignment).

The example master clock generator of FIG. 4A includes three flip-flop circuits (FF1-FF3) and one or more output buffers (BUFFERS). The first flip-flop circuit (FF1) includes a clock input that is coupled to the converter input clock signal (CLK), and is arranged in a toggle arrangement where the inverting output (i.e., QB) of the first flip-flop circuit (FF1) is coupled to the input (e.g., D) of the first flip-flop circuit (FF1). The toggled output (i.e., QB) of the first flip-flop circuit (FF1) is also coupled to the clock input of a second flip-flop circuit (FF2), which also is arranged as a toggle-type flip-flop with the inverting output (i.e., QB) of the second flip-flop circuit (FF2) is coupled to the input (e.g., D) of the second flip-flop-circuit (FF2). The output (e.g., QB) of the second flip-flop circuit (FF2) is also coupled to the input (e.g., D) of the third flip-flop circuit (FF3), which is arranged as a latch that is triggered by the converter input clock signal (CLK).

In operation, the arrangement of the flip-flop circuits FF1 and FF2 comprise a divider circuit that divides the converter input clock signal (CLK) by a factor of four. The third flip-flop circuit (FF3) operates as an optional time alignment mechanism that ensures that the CLK/4 signal from the output of the second flip-flop circuit (FF2) is aligned in the same time domain as the converter input clock signal (CLK). By latching into the converter input clock domain with flip-flop circuit FF3, proper setup and hold times can be achieved in circuits which require both the converter input clock signal (CLK) and its sub-harmonics. The buffers are arranged to generate any desired number of master reference clock signals (MCLKx, where x=1 . . . N) that each correspond to MCLKx=CLK/4. The period (TMCLK) of MCLKx can be expressed relative to the period (TCLK) of the converter input clock signal (CLK) as TMCLK=4*TCLK. Thus for an input clock having a frequency of 1 GHz and a period of 1 ns, the output clock has a frequency corresponds to 250 MHz and a period of 4 ns.

The master clock generator can either be implemented as part of an ADC circuit or a separate circuit. For instances where the master clock generator is part of an ADC circuit, the master clock signals MCLKx correspond to RCLKx from FIG. 2A and additional circuits within the ADC will use the generated CLK/4 signal to generate any required sub-harmonic clocks that are used by the core ADC functions, as will be described with reference to FIG. 4B.

The example slave clock generator includes a delay circuit (Td), a fourth flip-flop circuit (FF4) and one or more output buffers (BUFFERS). The input of the adjustable delay circuit (Td) is the reference input clock signal (RCLKIN) for the converter, which for the one or more of ADC circuits corresponds to a master reference clock signal (MCLKx), while for other ADC circuits it may corresponds to the reference output clock signal (RCLKx) from another ADC. The output of the adjustable delay circuit is coupled to the input (e.g., D) of the fourth flip-flop circuit (FF4). The converter input clock signal (CLK) is coupled to the clock input of the fourth flip-flop circuit (FF4). The output of flip-flop circuit FF3 is coupled to the input(s) of the one or more output buffers (BUFFERS), and also to additional circuits within the ADC circuit as will be described with reference to FIG. 4C.

In operation, the slave clock generator is arranged to time align the external reference clock (RCLKIN) using the adjustable delay circuit (Td). The reference clock (RCLKIN) is passed through the adjustable delay circuit (Td) prior to latching into the ADC's clock domain with the fourth flip-flop circuit (FF4), to allow proper setup and hold times to be achieved. The delay time of the adjustable delay circuit (Td) can be programmable using the program control signal (PROGRAM CTL).

FIG. 4B is another example implementation of a master clock generator circuit. The example illustrated in FIG. 4B is substantially similar to the implementation of FIG. 4A, with the addition of a sub-harmonic clock generator and ADC core circuits.

The sub-harmonic clock generator can be implemented as a counter as illustrated. The counter is arranged to generate all required sub-harmonics of the converter input clock signal (CLK) for the ADC core circuits. The ADC core circuits utilize the various clock signals from the sub-harmonic clock generator for sampling and converting the input signal (VIN) to data output signals (DATA1, DATA2). The ADC core circuits also generate the data output clock signal (DCLK) from the generated sub-harmonic clocks so that it is time aligned with the data output signals.

The counter of FIG. 4B includes two clock outputs (CLK2, CLK4) that are sub-harmonics of the converter input clocks signal (CLK), one with a frequency that is half that of the converter input clock signal (CLK), and one with a frequency that is one quarter that of the converter input clock signal (CLK). The first counter output (CLK2) is determined as CLK2=CLK/2, while the second counter output (CLK4) is given as CLK4=CLK/4. The corresponding periods can be expressed relative to the converter input clock signal as TCLK2=2*TCLK and TCLK4=4*TCLK. Thus for an input clock having a frequency of 1 GHz and a period of 1 ns, the output clocks have frequencies correspond to 500 MHz and 250 MHz with periods of 2 ns and 4 ns.

FIG. 4C is another example implementation of a slave clock generator circuit. The example illustrated in FIG. 4C is substantially similar to the implementation of FIG. 4A, with the addition of two latches (LATCH1, LATCH2), a multiplexer (MUX), additional flip-flop circuits (FF5, FF6, FF7), a sub-harmonic clock generator, and ADC core circuits.

The first latch circuit (LATCH1) is arranged to store an analog delay setting for the adjustable delay circuit (Td) in response to the program control signal (PROGRAM CTL). The second latch circuit (LATCH2) is arranged to store a digital delay setting in response to the program control signal (PROGRAM CTL). An optional third latch circuit (not shown) can also arranged to store an output clock setting in response to the program control signal (PROGRAM CTL) when adjustable output clock formats are required in a particular implementation.

The additional flip flop circuits (FF5-FF7) are arranged as single clock delay elements, each with a clock input corresponding to the converter input clock signal (CLK) and each receiving its input (e.g., D) from the prior flip-flop-circuits output. The output of all of the flip-flop circuits are coupled to corresponding inputs of multiplexer circuit MUX. The output of the multiplexer circuit corresponds to a selected one of the inputs, which is selected in response to the digital delay settings from the output of latch circuit LATCH2.

Similar to FIG. 4A, the sub-harmonic clock generator of FIG. 4C can be implemented as a counter that is arranged to generate all required sub-harmonics of the converter input clock signal (CLK) for the ADC core circuits. The ADC core circuits again utilize the various clock signals from the sub-harmonic clock generator for sampling and converting the input signal (VIN) to data output signals (DATA1, DATA2), and also generate the data output clock signal (DCLK) from the generated sub-harmonic clocks so that it is time aligned with the data output signals.

The counter of FIG. 4C includes two clock outputs (CLK2, CLK4), one with a frequency that is half that of the converter input clock signal (CLK), and one with a frequency that is one quarter that of the converter input clock signal (CLK). The first counter output (CLK2) is determined as CLK2=CLK/2, while the second counter output (CLK4) is given as CLK4=CLK/4. The corresponding periods can be expressed relative to the converter input clock signal as TCLK2=2*TCLK and TCLK4=4*TCLK. Thus for an input clock having a frequency of 1 GHz and a period of 1 ns, the output clocks have frequencies correspond to 500 MHz and 250 MHz, and corresponding periods of 2 ns and 4 ns. Since the sub-harmonic clock generators are identical between the master and all slave circuits, once all the slave circuits have the analog and digital delays adjusted so that the reset pulse for the counters of FIG. 4B and FIG. 4C are synchronized, the ADC core circuits which use both the sub-harmonic clocks and the converter input clock signal (CLK) will be synchronized.

Figure 5:
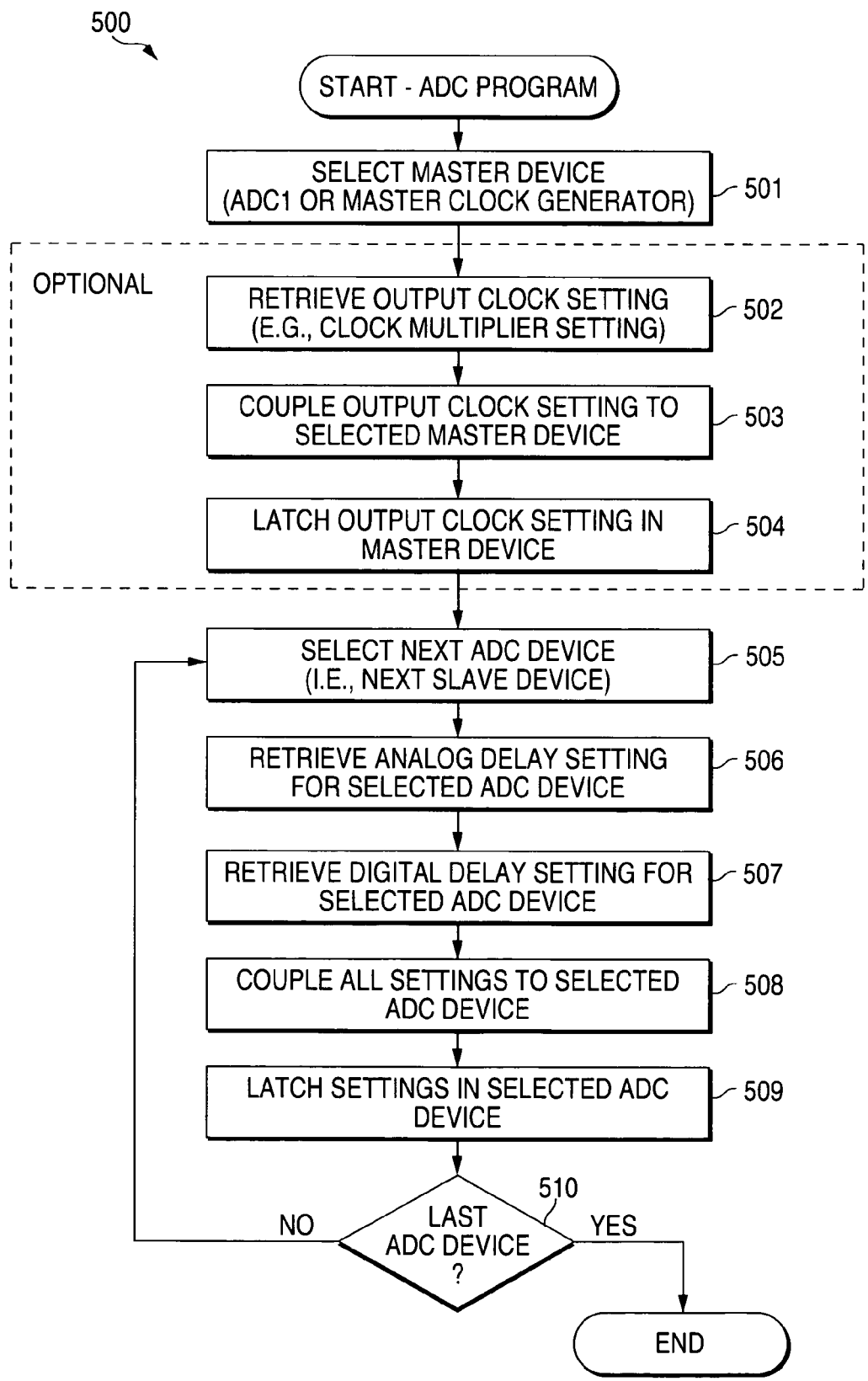
FIG. 5 is a flow diagram illustrating an example process flow (500) for programming master and slave circuits in multiple ADC systems with continuous synchronization capabilities.

FIG. 5 is a flow diagram illustrating an example process flow (500) for programming master and slave circuits in multiple ADC systems with continuous synchronization capabilities. Blocks 502 through 504 are optional blocks that are not necessary for implementations where the output clock settings (e.g., clock multiplier settings) are not programmable.

Beginning at block 501, a master device is selected as either an ADC circuit or a separate master clock generator circuit. Continuing to optional block 502, the output clock settings are retrieved such as from the prior stored settings. At optional block 503 the output clock settings are coupled to the selected master device, where the settings are latched in the master device at optional block 504. A processing loop begins for each of the slave devices at block 505, where the next ADC device that corresponds to a slave device is selected. Continuing to block 506, an analog delay setting for the selected ADC device is retrieved. At block 507, a digital delay setting for the selected ADC device is retrieved. Continuing to block 508, all of the setting for the selected ADC are coupled to the device (e.g., via PROGRAM CTL). Proceeding to block 509, the settings for the ADC are latched in the selected ADC device. Processing continues from block 509 to decision block 510. Processing flows from decision block 510 to block 505 for additional processing when additional ADC devices are to be configured. Otherwise, processing is terminated after block 510 when the last ADC device is configured.

Figure 6:
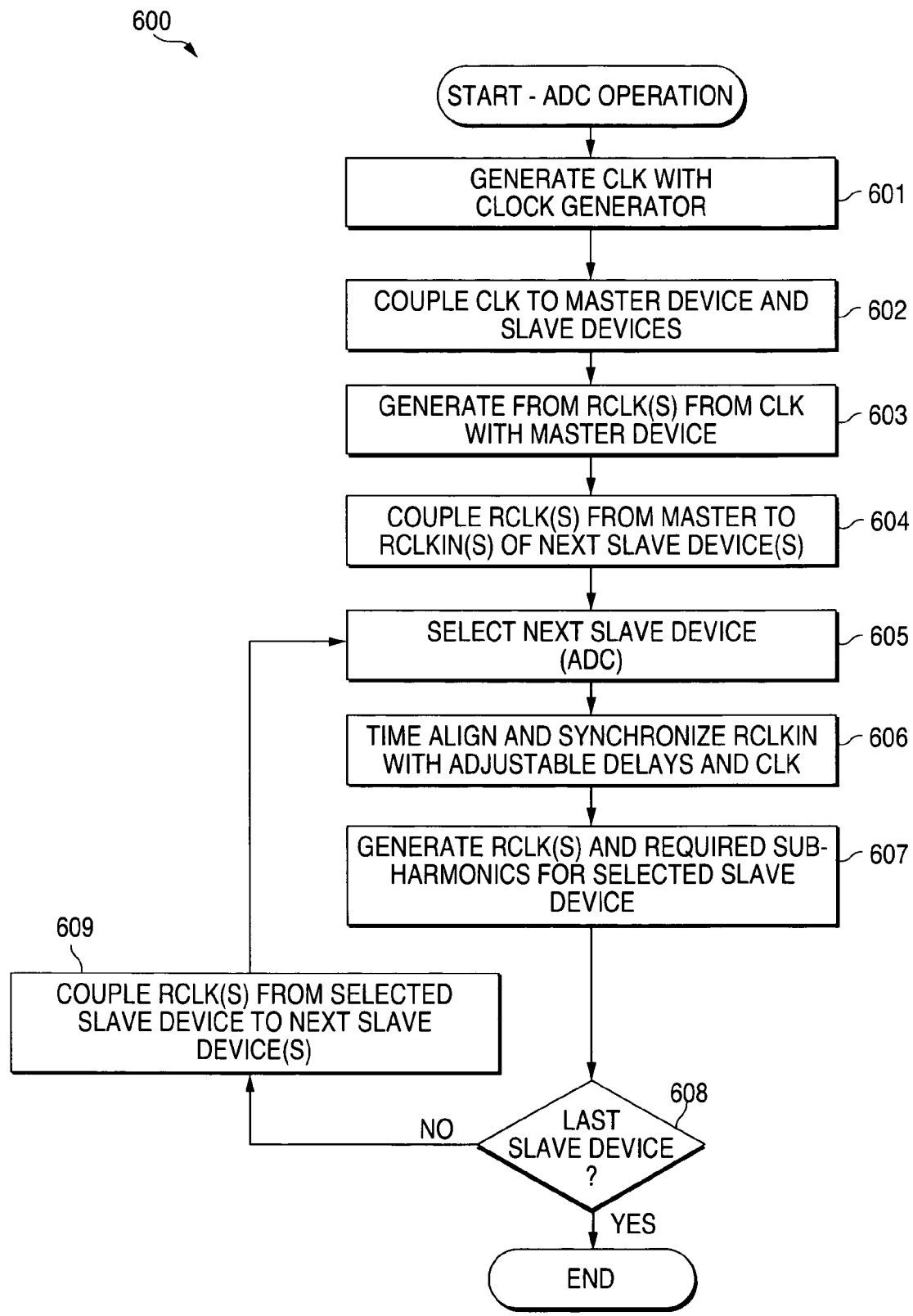
FIG. 6 is a flow diagram illustrating an example process flow (600) for operating master and slave circuits in multiple ADC system with continuous synchronization capabilities, all arranged in accordance with at least some aspects of the present disclosure.

FIG. 6 is a flow diagram illustrating an example process flow (600) for operating master and slave circuits in multiple ADC system with continuous synchronization capabilities. Beginning at block 601, the converter input clock signal (CLK) is generated such as by a clock generator circuit. At block 602, the converter input clock signal (CLK) is coupled to each master device (either within an ADC circuit or via a separate master clock generator) and each slave device (additional ADC circuits). Continuing to block 603, one or more reference clock signals RCLK(S) are generated by the master device using the converter input clock signal (CLK). Proceeding to block 604, the one or more reference clock signals RCLK(S) are coupled from the master device to reference input clock terminals RCLKIN(S) of each of the next slave device(s) that are coupled to the master device. A processing loop begins at block 605, where the next slave device is selected. At block 606, the selected slave device (or ADC configured as a slave) time aligns and synchronizes the reference input clocks signal (RCLKIN) using the adjustable delays (e.g., analog delays and/or digital delays) that that were previously programmed for the particular device (see FIG. 5). Block 606 can be achieved any portion of the example adjustable delay circuits previously described, (e.g., any one of circuits Td, FF4, FF5, FF6, FF7, or MUX), but the delay circuits are merely examples and many other possible equivalent delay adjustment circuits are contemplated (delay lines topologies of both analog and digital varieties). At block 607, the reference output clock signals RCLK(S) for the selected slave device are generated using the time aligned and synchronized version of the reference input clock signal (RCLKIN) and the converter input clock signal (CLK). Also at block 607, the time aligned and synchronized version of the reference input clock signal (RCLKIN) is used to generate (e.g., via a sub-harmonic clock generator counter, etc.) all required sub-harmonics for the ADC core circuits. Since the sub-harmonic clocks signals are generator from the time aligned and synchronized version of the reference input clock signal (RCLKIN), the ADC output signals (DCLK, DATA1, DATA2, RCLK1, RCLK2 ...) from the ADC core circuits in the selected ADC are appropriately aligned in the same domain as CLK. Processing continues from block 607 to decision block 608, which determines if the currently selected slave device (ADC) is the last one. Processing flows from decision block 608 to block 609 for additional processing when the currently selected slave device is not the last one. Otherwise, processing is terminated after block 608 when the currently selected slave device is the last slave device. At block 609, the reference output clock signals RCLK(S) generated by the selected slave device are coupled to each corresponding next slave device. Processing resumes from block 609 at block 605, where additional slave devices (ADCs) are selected.

The controller process for selecting analog delays, digital delays and output clock settings can, in some examples, be provided by a general purpose processor core such as a microprocessor or microcontroller, which is programmed by either a firmware mechanism (e.g., a flash memory, a ROM, an EPROM, an EEPROM, etc.) or a software mechanism (e.g., a software media that is loaded at run time). In some other examples, the controller process is provided with a logic circuit or a logic array such as a programmable logic device (PLD), a gate array, or some other wired-logic circuit. In still other examples, the controller process is a custom logic that is integrated together with the other portions of the ADC circuits.

Although the above implementations are illustrated as single-ended clock and data signals, the topologies are equally applicable to differential signals.

The described circuits, methods and apparatus are described above with reference to analog-to-digital converter (ADC) circuits that are configured in master slave arrangements. The topologies described herein are not limited to ADC circuits, and are equally applicable to digital-to-analog converter (DAC) circuits, where a synchronous high-frequency clock (CLK) is received and sub-harmonic clock signals are generated by and synchronized in a fixed phase relationship to each other.

In each described implementation, there is a single free-running master device that generates clocks that are sub-harmonics of the converter input clock signal (CLK). The other devices are configured as slave devices that are synchronized with respect to the master device. Each of the slave devices receives a reference input clock signal (RCLKIN) either directly from the master, or indirectly from the master through other slave devices. As illustrated and described herein, the reference input clock signal (RCLKIN) can be routed through a sequence of slave devices using daisy-chaining, through a binary tree (two reference output clock signals per device), or through a higher-order tree (greater than two reference output clock signals per device).

Although any variety of clock frequencies can be used, and programmed, a simplest implementation can include a single clock frequency which is a sub-harmonic of the converter input clock signal (CLK). The single clock frequency can be operated as the lowest required clock frequency (or sub-harmonic thereof).

Although the examples described above illustrate that a data output clock signal (DCLK) is used for each data output signal, this is not required in all implementations. For examples, the DCLK signal can be embedded with the data itself so that the data is self clocking. Such an implementation may be used to save output pins.

Although the examples described above illustrate that a reference output clock signal is generated in each ADC circuit, it is not always necessary for this clock signal to be accessible outside of the circuit and thus it would only used internal to the converter. As illustrated in FIG. 3F, a master clock generator circuit can be used to provide all of the reference clock signals for each of the ADC circuits (ADC1 ... ADCN). However, in some examples ADC circuits ADC1 through ADCN are not coupled to additional ADC circuits, and thus no reference output clock signals (RCLKx) would be required external from the ADC circuits. In such an example, the reference output clock signals are only used internal to the ADC circuits.

As described above, a variable delay can be adjusted in each of the ADC circuits so that each device can receive a reference input clock signal (RCLKIN) with the correct setup and hold times relative to the converter's input clock signal (CLK).

A digital interface can be provided to program each of the delay times for each slave device. The digital interface can be accessed by a processor, a digital control circuit, or some other appropriate mechanism for setting the delay times for the slave devices. Alternatively, a finite state machine or other digital control circuit can be arranged to determine the proper delay time for each slave device in a given system.

Although the preceding description describes various embodiments of the system, the invention is not limited to such embodiments, but rather covers all modifications, alternatives, and equivalents that fall within the spirit and scope of the invention. For example, the positioning of the various components may be varied, the functions of multiple components can be combined or divided, individual components may be separated into different components, or components can be substituted as understood in the art. Since many embodiments of the invention can be made without departing from the spirit and scope of the invention, the invention is not limited except as by the appended claims.

I claim:

1. An apparatus including a multiplicity of automatically synchronized analog-to-digital converter (ADC) circuits, wherein each ADC circuit is arranged to generate a corresponding digital data output signal (DATA) in response to a converter input clock signal (CLK) and a corresponding analog input signal (VIN), the apparatus comprising:

a master clock generator circuit that includes a master converter input clock terminal and a master reference output clock terminal, wherein the master clock generator circuit is arranged to receive the converter input clock signal (CLK) at the master converter input clock terminal and arranged to generate a master reference clock signal (MCLK) at the master reference output clock terminal, wherein the converter input clock signal (CLK) has a first frequency, wherein the master reference clock signal (MCLK) has a second frequency, and wherein the second frequency is a sub-harmonic of the first frequency;

a first ADC circuit that includes a first converter input clock terminal that is arranged to receive the converter input clock signal (CLK) and a first analog input terminal that is arranged to receive a first corresponding one of the analog input signals, wherein the first ADC circuit comprises:

a first slave clock generator circuit that is arranged to time align and synchronize a first reference input clock signal with the converter input clock signal (CLK) to generate a first reference output clock signal;

a first sub-harmonic clock generator circuit that is arranged to generate first sub-harmonic clock signals from the first reference output clock signal and the converter input clock signal (CLK); and a first ADC core circuit that is operated from the first sub-harmonic clock signals and also operated from the converter input clock signal (CLK) to sample and convert the first corresponding one of the analog input signals to a first corresponding one of the digital data output signals, wherein the first reference input clock signal corresponds to the master reference clock signal (MCLK); and a second ADC circuit that includes a second converter input clock terminal that is arranged to receive the converter input clock signal (CLK) and a second analog input terminal that is arranged to receive a second corresponding one of the analog input signals, wherein the second ADC circuit comprises:

a second slave clock generator circuit that is arranged to time align and synchronize a second reference input clock signal with the converter input clock signal (CLK) to generate a second reference output clock signal;

a second sub-harmonic clock generator circuit that is arranged to generate second sub-harmonic clock signals from the second reference output clock signal and the converter input clock signal (CLK); and a second ADC core circuit that is operated from the second sub-harmonic clock signals and also operated from the converter input clock signal (CLK) to sample and convert the second corresponding one of the analog input signals to a second corresponding one of the digital data output signals, wherein the second reference input clock signal corresponds to either the master reference clock signal (MCLK) or the first reference output clock signal, wherein the master clock generator circuit, the first ADC circuit, and the second ADC circuit are arranged in cooperation with one another such that the reference input clock signals are synchronized with respect to the master reference clock signal.

2. The apparatus of claim 1, wherein the ADC core circuits are arranged to generate separate data output clock signals that are aligned to their respective digital data output signals.

3. The apparatus of claim 2, wherein the separate data output clock signals are embedded within their respective digital data output signals.

4. The apparatus of claim 1, wherein the master clock generator circuit, the first ADC circuit, and the second ADC circuit are arranged such that each of the master reference clock signal, the first reference output clock signal and the second reference output clock signal is either a single-ended signal or a differential signal.

5. The apparatus of claim 1, wherein the first ADC circuit and the second ADC circuit are arranged such that each of the first analog input signal and the second analog input signal is either a single-ended signal or a differential signal.

6. The apparatus of claim 1, wherein the converter input clock signal (CLK) is either a single-ended signal or a differential signal.

7. The apparatus of claim 1, wherein the master clock generator circuit corresponds to a portion of a third ADC circuit that includes a third converter input clock terminal that corresponds to the master converter input clock terminal and a third analog input terminal that is arranged to receive a third corresponding one of the analog input signals, wherein the third ADC circuit further comprises:

a third sub-harmonic clock generator circuit that is arranged to generate third sub-harmonic clock signals from the master reference clock signal and the converter input clock signal (CLK); and a third ADC core circuit that is operated from the third sub-harmonic clock signals and also operated from the converter input clock signal (CLK) to sample and convert the third corresponding one of the analog input signals to a third corresponding one of the digital data output signals.

8. The apparatus of claim 1, the master clock generator circuit comprising:

a first flip-flop circuit that includes a first clock input that is coupled to the master converter input clock terminal and a first flip-flop signal input that is coupled to an output of the first flip-flop circuit to form a first divider circuit; and a second flip-flop circuit that includes a second clock input that is coupled to the output of the first flip-flop circuit and a second flip-flop signal input that is couple to an output of the second flip-flop circuit to form a second divider circuit.

9. The apparatus of claim 8, the master clock generator circuit further comprising a plurality of buffer circuits that each include a buffer input terminal and a buffer output terminal, wherein the buffer input terminals are coupled in common to an output of the second flip-flop circuit, and wherein each buffer output terminal corresponds to a separate reference clock output of the master clock generator circuit.

10. The apparatus of claim 8, the master clock generator circuit further comprising a third flip-flop circuit that includes a third clock input that is coupled to the master converter input clock terminal and a third flip-flop signal input that is coupled to an output of the second flip-flop circuit, wherein an output of the third flip-flop circuit is coupled to the master reference output clock terminal.

11. The apparatus of claim 10, each slave clock generator circuit including a corresponding reference input clock terminal and converter input clock terminal, each slave clock generator circuit comprising:

a delay circuit that includes a delay signal input terminal that is coupled to the corresponding reference input clock terminal, wherein the delay circuit is arranged to generate a delayed output signal that is delayed in time by a programmed amount of analog delay with respect to an input signal received from the corresponding reference input clock terminal; and a fourth flip-flop circuit that includes a fourth clock input that is coupled to the corresponding converter input clock terminal of the slave clock generator circuit and a fourth flip-flop signal input that is arranged to receive the delayed output signal, wherein the fourth flip-flop circuit is arranged to generate a fourth flip-flop output in response to the converter input clock signal and the delayed output signal.

12. The apparatus of claim 11, wherein the programmed amount of analog delay for each slave clock generator circuit is adjusted in response to a program control signal such that each of the slave clock generator circuits has a separately programmable analog delay time.

13. The apparatus of claim 12, each slave clock generator circuit further comprising a latch circuit that includes a latch input that is coupled to a program control input terminal for the slave clock generator circuit and a latch output that is coupled to a delay control input of the delay circuit, wherein the latch circuit is arranged to store a setting for the separately programmable analog delay time.

14. The apparatus of claim 11, each slave clock generator circuit further comprising a plurality of buffer circuits that each includes a buffer input terminal and a buffer output terminal, wherein the buffer input terminals are coupled in common to the fourth flip-flop output, and wherein each buffer output terminal corresponds to a separate reference clock output of the slave clock generator circuit.

15. The apparatus of claim 11, each slave clock generator circuit further comprising:
a fifth flip-flop circuit that includes a fifth clock input that is coupled to the corresponding converter input clock terminal of the slave clock generator circuit, a fifth flip-flop signal input that is coupled to the fourth flip-flop output, and a fifth flip-flop output;
a sixth flip-flop circuit that includes a sixth clock input that is coupled to the corresponding converter input clock terminal of the slave clock generator circuit, a sixth flip-flop signal input that is coupled to the fifth flip-flop output, and a sixth flip-flop output;
a seventh flip-flop circuit that includes a seventh clock input that is coupled to the corresponding converter input clock terminal of the slave clock generator circuit, a seventh flip-flop signal input that is coupled to the sixth flip-flop output, and a seventh flip-flop output;
a multiplexer circuit that includes a first multiplexer input coupled to the fourth flip-flop output, a second multiplexer input coupled to the fifth flip-flop output, a third multiplexer input coupled to the sixth flip-flop-output, a fourth multiplexer input coupled to the seventh flip-flop output, a selector input, and a multiplexer output; and
a latch circuit that includes a latch input that is coupled to a program control input terminal for the slave clock generator circuit and a latch output that is coupled to the selector input of the multiplexer circuit, wherein the latch circuit is arranged to store a program control for selecting a digital delay setting from one of the outputs of the fourth, fifth, sixth, and seventh flip-flop circuits via the multiplexer circuit.

16. The apparatus of claim 1, each of the sub-harmonic clock generator circuits comprising a counter circuit that includes a reset terminal for receiving the corresponding one of the reference output clock signals, a counter terminal for receiving the converter input clock signal, and a plurality of output terminals for providing the corresponding sub-harmonic clock signals.

17. The apparatus of claim 1, wherein the first ADC circuit and the second ADC circuit form a portion of an array of ADC circuits arranged in a daisy-chained configuration, where a corresponding reference output clock terminal for a preceding ADC circuit is coupled to a corresponding reference input clock terminal for a succeeding ADC circuit.

18. The apparatus of claim 1, wherein the first ADC circuit and the second ADC circuit form a portion of an array of ADC circuits arranged in a tree configuration, where a first corresponding reference output clock terminal from a preceding ADC circuit is coupled to a first corresponding reference input clock terminal for a first succeeding ADC circuit, and where a second corresponding reference output clock terminal from the preceding ADC circuit is coupled to a second corresponding reference input clock terminal for another succeeding ADC circuit.

19. A system for automatically synchronizing a multiplicity of analog-to-digital converter (ADC) circuits, wherein each ADC circuit is arranged to convert a corresponding analog input signal (VIN) into a corresponding digital data output signal (DATA) using a converter input clock signal (CLK), the system comprising:
a master clock generator circuit that is arranged to receive the converter input clock signal (CLK) and arranged to generate a master reference clock signal (MCLK), wherein the converter input clock signal (CLK) has a first frequency, wherein the master reference clock signal (MCLK) has a second frequency, and wherein the second frequency is a sub-harmonic of the first frequency;
a multiplicity of ADC circuits arranged in a structured configuration, wherein each of the ADC circuits is arranged to:
receive the converter input clock signal and the corresponding one of the analog input signals,
receive one of the master reference clock signal and a reference output clock signal from another one of the ADC circuits as a corresponding reference input clock signal,
time align and synchronize the corresponding reference input clock signal using a previously programmed delay for the corresponding ADC circuit with a corresponding slave clock generator circuit that is responsive to the converter input clock signal and the corresponding reference input clock signal to generate a time aligned and synchronized version of the reference input clock signal,
generate reference output clock signals for the corresponding ADC circuit using the corresponding time aligned and synchronized version of the reference input clock signal and the converter input clock signal,
generate sub-harmonic clock signals for the corresponding ADC circuit using the corresponding time aligned and synchronized version of the reference input clock signal and the converter input clock signal (CLK), and
convert the corresponding analog input signal to the corresponding digital data output signal using the generated sub-harmonic clock signals and the converter input clock signal (CLK) such that the corresponding digital data output signal is aligned with a corresponding data output clock signal; and
a controller circuit that is arranged to selectively control delay timing adjustments for each of the ADC circuits such that each ADC circuit has a separately controllable delay time associated with the time alignment of the corresponding reference output clock signal.

20. The system of claim 19, wherein the ADC circuits are arranged such that the data output clock signals are embedded within their respective digital data output signals.

21. The system of claim 19, wherein the multiplicity of ADC circuits are arranged such that the structured configuration corresponds to a daisy-chained configuration, where a corresponding reference output clock terminal for a preceding ADC circuit is coupled to a corresponding reference input clock terminal for a succeeding ADC circuit in a sequential array.

22. The system of claim 19, wherein the wherein the multiplicity of ADC circuits are arranged such that the structured configuration corresponds to a tree configuration, where a first corresponding reference output clock terminal for a preceding ADC circuit is coupled to a first corresponding reference input clock terminal for a first succeeding ADC circuit, and where a second corresponding reference output clock terminal for the preceding ADC circuit is coupled to a second corresponding reference input clock terminal for another succeeding ADC circuit forming a treed array.

23. The system of claim 19, wherein the controller circuit is arranged to selectively initiate loading of delay time adjustments for the ADC circuits in response at least one of a power-on-reset condition, a periodically initiated initialization, or a demand based initialization.

24. The system of claim 23, wherein the delay time adjustments correspond to one of analog delays and digital delays.

25. The system of claim 23, wherein the controller is arranged to select an output clock multiplier for the master clock generator circuit and each ADC circuit.

26. The system of claim 19, wherein the controller circuit comprises at least one of a microprocessor, a microcontroller, a digital logic circuit, a logic circuit, a logic array or a custom logic circuit.

27. A method for automatically synchronizing a multiplicity of analog-to-digital converter (ADC) circuits, wherein each ADC circuit is arranged to convert a corresponding analog input signal (VIN) into a corresponding digital data output signal (DATA) using a converter input clock (CLK), the method comprising:
  generating a master reference clock signal (MCLK) from the converter input clock signal (CLK) with a master clock generator such that a frequency associated with the master reference clock signal (MCLK) is a sub-harmonic of a frequency associated with the converter input clock signal;
  coupling the master reference clock signal (MCLK) to at least one of the ADC circuits;
  for each ADC circuit from the multiplicity of ADC circuit,
    receiving the converter input clock signal (CLK) and the corresponding one of the analog input signals,
    receiving one of the master reference clock signal (MCLK) and a reference output clock signal (RCLK) from another one of the ADC circuits as a corresponding reference input clock signal (RFINCLK);
    time aligning and synchronizing the corresponding reference input clock signal (RFINCLK) using a previously programmed delay for the corresponding ADC circuit with a corresponding slave clock generator circuit that is responsive to the converter input clock signal (CLK) and the corresponding reference input clock signal (RFINCLK) to generate a time aligned and synchronized version of the reference input clock signal,
    generating reference output clock signals (RCLKx) for the corresponding ADC circuit using the corresponding time aligned and synchronized version of the reference input clock signal and the converter input clock signal (CLK),
    generating sub-harmonic clock signals for the corresponding ADC circuit using the corresponding time aligned and synchronized version of the reference input clock signal and the converter input clock signal (CLK), and
    converting the corresponding analog input signal to the corresponding digital data output signal using the generated sub-harmonic clock signals and the converter input clock signal (CLK) such that the corresponding digital data output signal (DATA) is aligned with a corresponding data output clock signal (DCLK); and
  selectively adjusting the delay timing for each of the ADC circuits with a controller circuit, wherein each ADC circuit has a separately controllable delay time associated with the time alignment of the corresponding reference output clock signal.

* * * * *

UNITED STATES PATENT AND TRADEMARK OFFICE
CERTIFICATE OF CORRECTION

PATENT NO.       : 7,728,753 B2                                  Page 1 of 1
APPLICATION NO.  : 12/250437
DATED            : June 1, 2010
INVENTOR(S)      : Robert Callaghan Taft et al.

It is certified that error appears in the above-identified patent and that said Letters Patent is hereby corrected as shown below:

Column 14, claim 9, line 22, delete "include" and replace with --includes--;

Column 14, claim 11, line 36, insert --a-- before the term "converter";

Column 17, claim 27, line 24, delete "circuit" (last occurrence) and replace with --circuits--.

Signed and Sealed this
Fifth Day of April, 2011

David J. Kappos
*Director of the United States Patent and Trademark Office*